Figure 1:
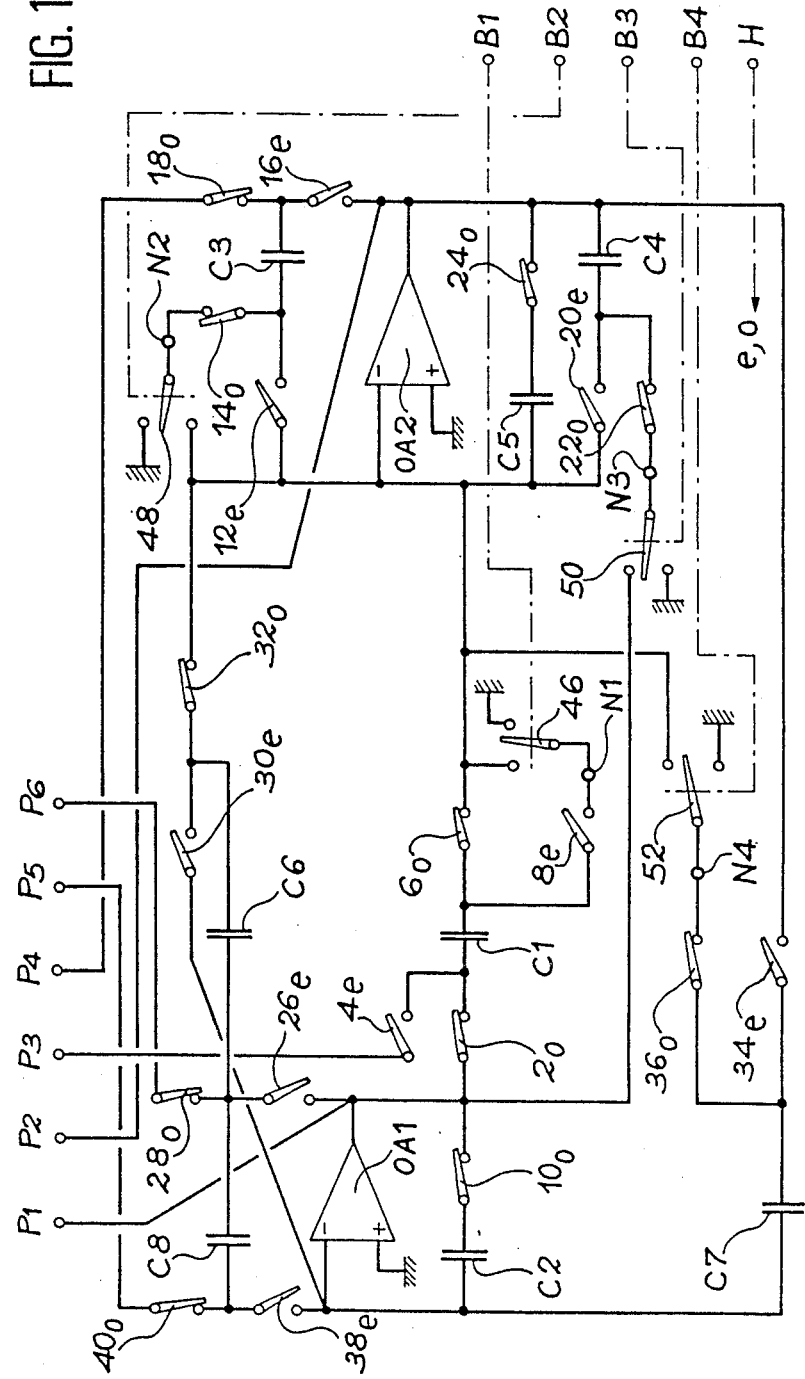

United States Patent [19]

Mulawka et al.

[11] Patent Number: 4,841,263
[45] Date of Patent: Jun. 20, 1989

[54] BIQUAD BLOCK WITH SWITCHED CAPACITORS WITHOUT CONTINUOUS FEEDBACK LOOP AND WITH NO SENSITIVITY COMPARED WITH THE GAIN OF OPERATIONAL AMPLIFIERS AND THE RATIO OF THE CAPACITANCES

[75] Inventors: Jan Mulawka, ul. Bernardyn ka 3-M41 02904, Warszawa, Poland; Agnieszka Konczykowska, L'Haye les Roses; Michel Bon, Verrieres Le Buisson, both of France

[73] Assignees: Etat Francais représenté0 par le Ministre Délégué des Postes et Télécommunications (CNET), Moulineaux, France; Jan Mulawka, Warsaw, Poland

[21] Appl. No.: 234,277

[22] Filed: Aug. 19, 1988

[30] Foreign Application Priority Data

Aug. 28, 1987 [FR] France .................................. 87 12028

[51] Int. Cl.$^4$ ............................................ H03H 19/00
[52] U.S. Cl. ................................. 333/173; 328/167; 307/520; 330/9; 330/109
[58] Field of Search ................ 333/173, 172, 174, 19, 333/167; 328/151, 167; 307/520; 330/9, 51, 107, 109; 364/724.01

[56] References Cited

U.S. PATENT DOCUMENTS 4,370,632 1/1983 Allgood et al. ..................... 333/173
4,494,082 1/1985 Bennett ........................... 333/173 X
4,531,106 7/1985 Ganesan .............................. 330/9 X
4,623,854 11/1986 Kuraishi .............................. 333/173

OTHER PUBLICATIONS

Said et al., "Stray-free switched-capacitor general biquad blocks", IEE Proceedings, vol. 133, Pt. G. No. 3, June 1986, pp. 154–158.
Mohan et al., "Parasitic—Compensated Single Amplifier ... SC Biquad", IEEE Transactions on Circuits and Sys. vol. Case-33, No. 4, Apr. 1986, pp. 458–460.
Eriksson et al. "Offset—Compensated Switched-Capacitor Leapfrog filters", Electronics Letters, vol. 20, No. 18, Aug. 30, 1984, pp. 731–733.

Primary Examiner—Eugene R. Laroche
Assistant Examiner—Seung Ham
Attorney, Agent, or Firm—Norman P. Soloway

[57] ABSTRACT

The biquad block or cell comprises two operational amplifiers OA1, OA2, eight capacitors C1–C8 and switches comprises switches of reference o and switches of reference e controlled by a clock signal H. The biquad block has six connections P1–P6 and can be used as low-pass, band-pass or high-pass filters, as a function of the connections chosen for the input and output of the signal to be filtered. Switches 46 to 52 make it possible to select one from among several configurations for each filtering function. The different configurations are distinguished by their sensitivities to the gain of the operational amplifiers and to the capacitance ratio. Application to the filtering of signals in the video range (a few megahertz).

10 Claims, 6 Drawing Sheets

BIQUAD BLOCK WITH SWITCHED CAPACITORS WITHOUT CONTINUOUS FEEDBACK LOOP AND WITH NO SENSITIVITY COMPARED WITH THE GAIN OF OPERATIONAL AMPLIFIERS AND THE RATIO OF THE CAPACITANCES

DESCRIPTION

The present invention relates to a biquad block or cell with switched capacitors and without a continuous feedback loop. The invention relates to the processing of signals in the video range, i.e. signals with a frequency of a few megahertz.

Biquad blocks are filters of the second order. For producing a filter of order n greater than 2, it is sufficient to arrange in cascade n/2 biquad blocks, if n is even or (n−1)/2 biquad blocks, plus a filter of the first order if n is uneven.

Switched capacitor biquad blocks appeared about ten years ago in scientific literature and have rapidly given rise to industrial applications in MOS technology in the field of the processing of the low frequency signal, essentially the audio spectrum.

More recently, the rise in the performance characteristics of operational amplifiers has made it possible to use switched capacitor biquad blocks in the field of video signal processing (a few megahertz).

Switched capacitor biquad blocks comprise operational amplifiers, capacitors and switches. In such a circuit, an electrical resistance is simulated by a capacitor and two switches. The resistance value is 1/fC, in which f is the switching frequency of the switches and C the capacitance of the capacitor. The frequency of the clock switching signal of the switches must be roughly 20 times higher than the frequency of the signal to be processed. In the field of high frequency switched capacitor biquad cells, research has been oriented toward circuits with a low sensitivity compared with the gain of operational amplifiers, because for applications in the high frequency range only simple operational amplifiers with a relatively low gain can be used.

In article A1, given in the appendix, it is proposed to reduce the finite gain effect by introducing a buffer and three switches into a Fleischer-Laker biquad block, of the type described in article A2.

Such a biquad block is not satisfactory because it has additional elements making it more complex. Moreover, the total capacitance of the capacitors is high, so that there is a large biquad block in integrated form.

Switched capacitor integrators without a continuous feedback loop are known, which make it possible to minimize the influence of the finite gain of the amplifiers. Such integrators are described in articles A3, A4 and A5. The use of these integrators for producing a filter requires the introduction of a summating amplifier for separating the successive stages of the filter, or the use of a three-phase clock.

Finally, a biquad block without a continuous feedback loop is described in article A6. This biquad block comprises two operational amplifiers and 9 to 15 capacitors. The sensitivity of this biquad block to the passive elements, i.e. the sensitivity with respect to a variation of the relative values of the capacitors is not controlled and can be high. In the same way, the sensitivity with respect to the gain of the operational amplifiers is relatively high.

The object of the invention is to obviate these disadvantages of known switched capacitor biquad blocks. It relates to a biquad block without a continuous feedback loop and having a low sensitivity compared with the gain of the operational amplifiers, a low sensitivity with respect to the capacitance ratio and a low total capacitance.

The invention also relates to a biquad block incorporating a plurality of input-output connections and making it possible to obtain different filtering functions as a function of the choice of the input connection and output connection of the signal to be processed.

Finally, the invention relates to a biquad block having switches making it possible to select, for each filtering function, one circuit configuration from among a plurality of configurations having different sensitivites compared with the gain of the operational amplifiers and compared with the capacitance ratio.

Specifically, the invention relates to a switched capacitor biquad block incorporating six input-output connections P1, P2, ..., P6 and a clock input H for receiving a clock signal for controlling the closing and opening of a group of switches, said switches comprising a first family of switches controlled in the open state during a first half-cycle of each cycle of the clock signal and which are controlled in the closed state during a second half-cycle of each cycle of the clock signal and a second family of switches controlled in the closed state during said first half-cycle of each cycle of the clock signal and in the closed state during said second half-cycle of each cycle of the clock signal, said biquad block comprising:

a first operational amplifier OA1 provided with a non-inverting input connected to earth, an inverting input E1 and an inverting output S1 connected to the first connection P1 of the filter, a second operational amplifier OA2 provided with a non-inverting input connected to earth, an inverting input E2 and an output S2 connected to the second connection P2 of the filter, a first capacitor C1 and switches for connecting said capacitor between the output S1 of the first operational amplifier and the input E2 of the second operational amplifier during said first half-cycles of the clock signal and for connecting said capacitor to the connection P3 and to a node N1 during said second half-cycles of the clock signal, a second capacitor C2 and switches for connecting said capacitor between the input E1 and the output S1 of the first operational amplifier during said first half-cycles of the clock signal and for connecting said capacitor solely to the input E1 of the first operational amplifier during said second half-cycles of the clock signal, a third capacitor C3 and switches for connecting said capacitor between a node N2 and connection P4 during said first half-cycles of the clock signal and for connecting said capacitor between the input E2 and the output S2 of the second operational amplifier during said second half-cycles of the clock signal, a fourth capacitor C4 and switches for connecting said capacitor between a node N3 and the output S2 of the second operational amplifier during said first half-cycles of the clock signal and for connecting said capacitor between the input E2 and the output S2 of the second operational amplifier during said second half-cycles of the clock signal, a fifth capacitor C5 and switches for connecting said capacitor between input E2 and output S2 of the second operational amplifier during said first half-cycles of the clock signal and for connecting said capacitor solely to the input E2 of the second operational amplifier during said second half-cycles of the clock signal, a sixth capacitor C6 and switches for connecting said capacitor between connection P6 and input E2 of the second operational amplifier during said first half-cycles of the clock signal and for connecting said capacitor between output S1 and input E1 of the first operational amplifier during said second half-cycles of the clock signal, a seventh capacitor C7 and switches for connecting said capacitor between input E1 of the first operational amplifier and a node N4 during said first half-cycles of the clock signal and for connecting said capacitor between input E1 of the first operational amplifier and output S2 of the second operational amplifier during said second half-cycles of the clock signal, an eighth capacitor C8 and switches for connecting said capacitor between connections P5 and P6 during said first half-cycles of the clock signal and for connecting said capacitor between input E1 and output S1 of the first operational amplifier during said second half-cycles of the clock signal, and four two-position switches controlled by signals applied to terminals B1, B2, B3, B4 of the biquad block, the first switch connecting node N1 to input E2 of the second operational amplifier or to earth, the second switch connecting node N2 to input E2 of the second operational amplifier or to earth, the third switch connecting node N3 to output S1 of the first operational amplifier or to earth and the fourth switch for connecting node N4 to input E2 of the second operational amplifier or to earth.

This biquad block makes it possible to produce low-pass, band-pass or high-pass filters, as a function of the connections chosen for applying the signal to be filtered and for collecting the filtered signal.

For a given filtering function, the sensitivity of the filter with respect to gain variations of the operational amplifiers and the sensitivity with respect to the capacitance ratio can be chosen by controlling the double switches.

The characteristics and advantages of the invention can be better gathered from the illustrative and non-limitative description with reference to the attached drawings, wherein show:

FIG. 1 Diagrammatically an embodiment of the biquad block according to the invention.

Figure 2:
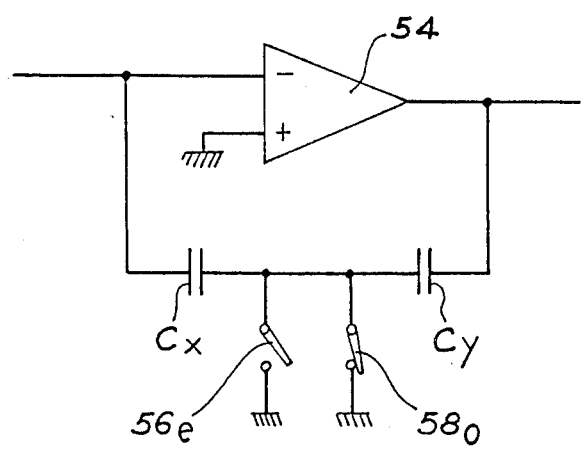

FIG. 2 Diagrammatically a feedback loop conventionally used for stabilizing an operational amplifier of a switched capacitor block without continuous feedback loops.

Figure 3:
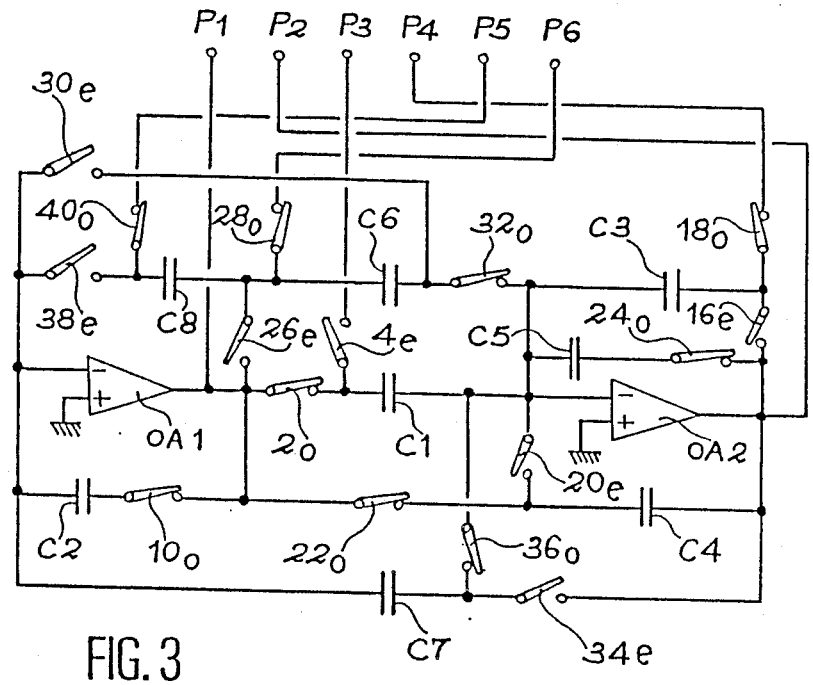

FIG. 3 Diagrammatically a biquad block with low sensitivity compared with the gain of the operational amplifiers, said block corresponding to a first configuration of the biquad block of FIG. 1.

Figure 4A:
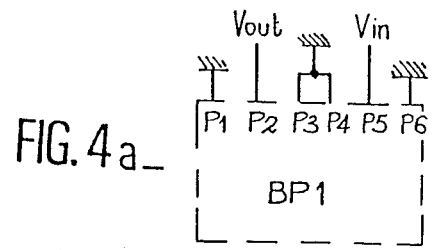
Figures 4B, 4C:
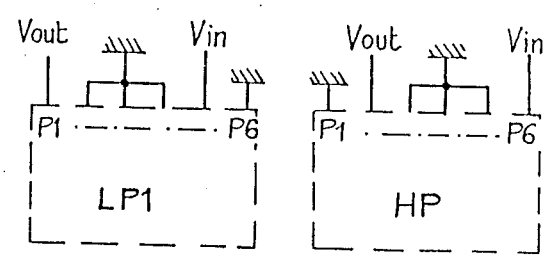

FIGS. 4a to 4c Different filters obtained in accordance with the signals applied to the input-output connections P1–P6 of the biquad block of FIG. 3.

Figure 5:
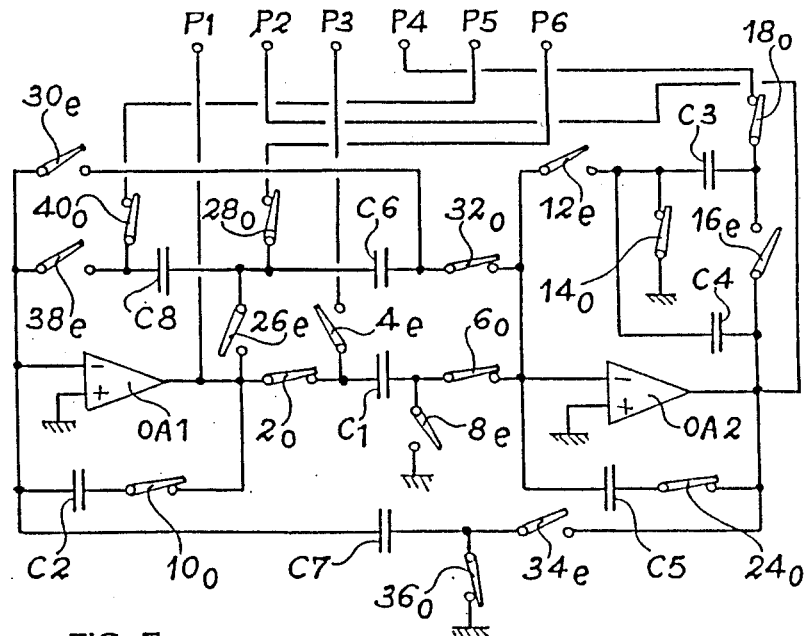

FIG. 5 Diagrammatically a biquad block having a low sensitivity compared with the capacitance ratio, said block corresponding to a second configuration of the biquad block of FIG. 1.

FIGS. 6a to 6e Various filters obtained in accordance with the signals applied to the input-output connections P1–P6 of the biquad block of FIG. 5.

Figure 7:
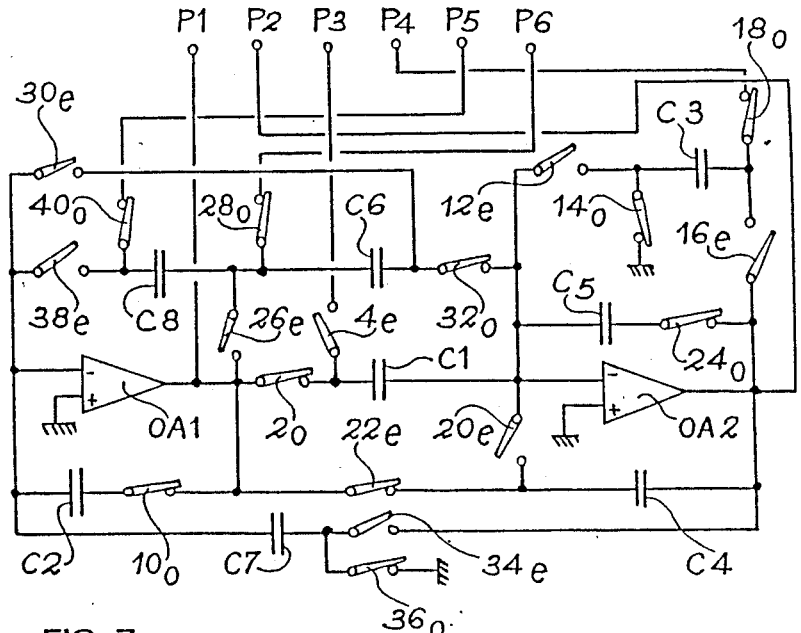
Figures 8A, 8B:
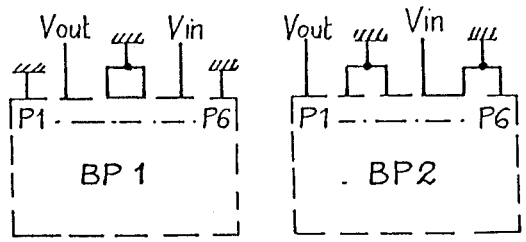
Figures 8C, 8D:
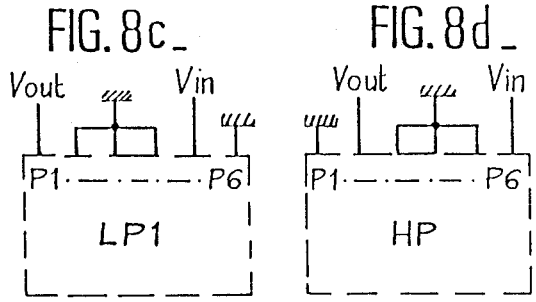

FIG. 7 Diagrammatically a block constituting a compromise between the blocks shown in FIGS. 3 and 5, said block corresponding to a third configuration of the block shown in FIG. 1.

FIGS. 8a to 8d Different filters obtained according to the signals applied to the input-output connections P1–P6 of the biquad block of FIG. 7.

Figure 9:
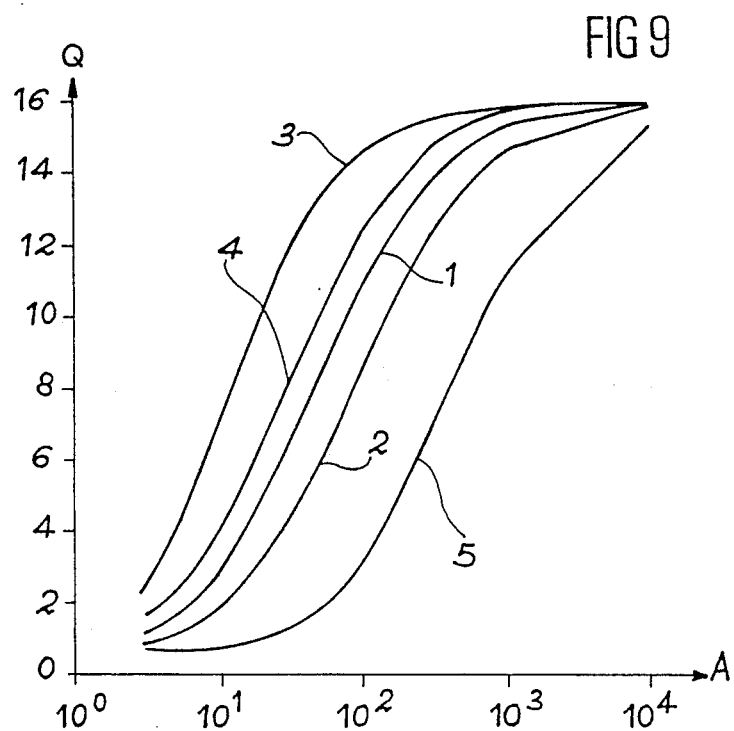
Figure 10:
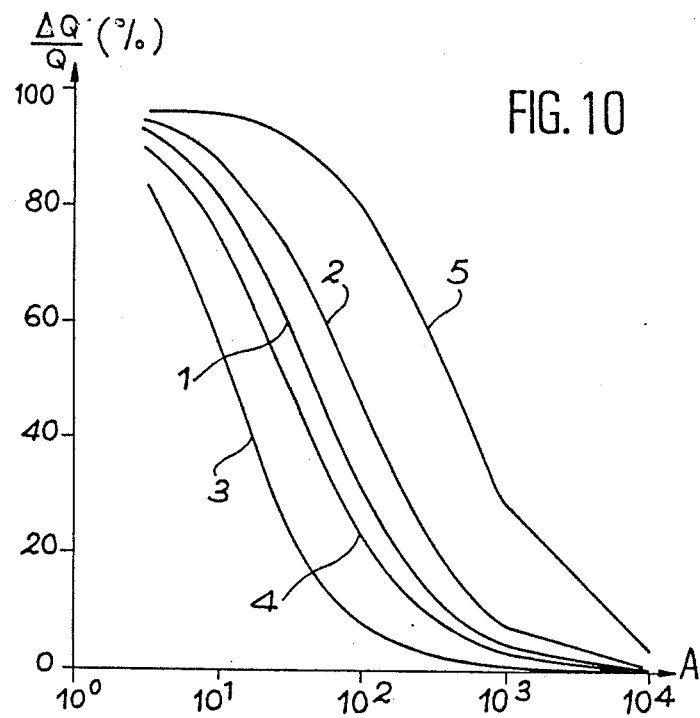
Figure 11:
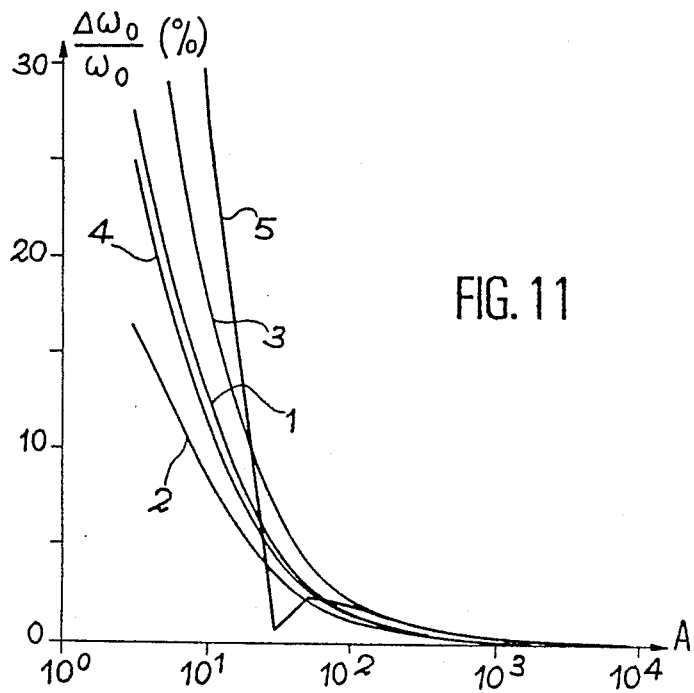

FIGS. 9, 10 & 11 Graphs respectively showing the overvoltage factor Q, the relative error on the overvoltage factor $\Delta Q/Q$ and the relative error $\Delta \omega_o/\omega_o$, in which $\omega_o$ is the ripple corresponding to the centre frequency of the signal to be processed, as a function of the gain of the operational amplifiers for known biquad blocks and biquad blocks according to the invention.

The biquad block or cell according to the invention is more particularly used for the processing of signals in the video range, i.e. having a centre frequency of approximately a few megahertz. Such a biquad block is advantageously produced in MESFET (DFET) technology on GaAs and the control signal of the switches has a frequency of a few hundred megahertz.

An embodiment of the biquad block according to the invention is shown in FIG. 1. This biquad block comprises a first operational amplifier OA1, a second operational amplifier OA2, eight capacitors C1–C8 and switches controlled by a clock signal H. These switches comprise a first family of switches designated e, which are open during the first-cycle of each cycle of the clock signal and which are closed during the second half-cycle of each cycle of the clock signal and a second family of switches designated o, which are closed during the first half-cycle of each cycle of the clock signal and which are open during the second half-cycle of each cycle of the clock signal.

The biquad block according to the invention has six input-output connections P1, P2, ..., P6 making it possible to define different filtering functions in accordance with the connection chosen for applying the signal to be filtered and the connection chosen for collecting the filtered signal.

The operational amplifiers OA1, OA2, each comprise an inverting input, a non-inverting input connected to earth and an output. The output of amplifier OA1 is connected to connection P1 and the output of amplifier OA2 is connected to connection P2.

One end of capacitor C1 is connected on the one hand to the output of the operational amplifier OA1 across a switch $2_o$ and on the other hand to connection P3 across a switch $4_e$, whilst another end is connected on the one hand to the inverting input of operational amplifier OA2 across a switch $6_o$ and on the other hand to a node N1 across a switch $8_e$. One end of capacitor C2 is connected to the inverting input of operational amplifier OA1 and another end is connected across a switch $10_o$ to the output of operational amplifier OA1. One end of capacitor C3 is connected on the one hand to the inverting input of operational amplifier OA2 by a switch $12_e$ and on the other hand to a node N2 by a switch $14_o$ and its second end is connected on the one hand to the output of operational amplifier OA2 by a switch $16_e$ and on the other hand to connection P4 by switch $18_o$. One end of capacitor C4 is connected on the one hand to the inverting input of operational amplifier OA2 by a switch $20_e$ and on the other hand to a node N3 by a switch $22_o$ and another end is connected to the output of operational amplifier OA2. One end of capacitor C5 is connected to the inverting input of operational amplifier OA2 and another end is connected by a switch $24_o$ to the output of operational amplifier OA2. One end of capacitor C6 is connected on the one hand to the output of operational amplifier OA1 by a switch $26_e$ and on the other hand to connection P6 by a switch $28_o$ and a second end connected on the one hand to the inverting input in operational amplifier OA1 by a switch $30_e$ and on the other hand to the inverting input of operational amplifier OA2 by a switch $32_o$. Capacitor C7 has one end connected to the inverting input of operational amplifier OA1 and another end connected on the one hand to the output of operational amplifier OA2 by a switch $34_e$ and on the other hand to a node N4 by a switch $36_o$. One end of capacitor C8 is connected on the one hand to the inverting input of operational amplifier OA1 by a switch $38_e$ and on the other hand to connection P5 by a switch $40_o$ and another end is connected on the one hand to the output of operational amplifier OA1 by switch $26_e$ and on the other hand to connection P6 by switch $28_o$.

The biquad block according to the invention also comprises four two-position switches making it possible, for each filtering function defined by a choice of the input and output connections, to obtain different configurations of the biquad block, which are distinguished by their sensitivity to the gain of the operational amplifiers and to the capcitance ratio. The state of switches 46, 48, 50, 52 is controlled by signals applied to terminal B1, B2, B3, B4 of the biquad block.

Switch 46 is arranged in such a way as to connect node N1 to teh inverting input of the operational amplifier OA2 or to earth. Switch 48 is arranged in such a way as to connect node N2 to the inverting input of operational amplifier OA2 or to earth. Switch 50 is arranged in such a way as to connect node N3 to the output of operational amplifier OA1 or to earth and switch 52 is arranged in such a way as to connect node N4 to the inverting input of the operational amplifier OA2 or to earth.

The biquad block according to the invention, whereof a mode is diagrammatically shown in FIG. 1, does not have a continous feedback loop. For stabilizing the operational amplifiers, it is known to introduce on each of them two small capacitance capacitors which produce a feedback loop, as is diagrammatically shown in FIG. 2. In the latter, an operational amplifier 54 comprises a feedback loop constituted by a capacitor Cx and a capacitor Cy connected in series. Two switches $56_e$ and $58_o$ are also located, each between the common point of the capacitors and earth. This feedback loop is in particles described in articles A6 and A7.

FIG. 3 shows an equivalent circuit to the biquad block shown in FIG. 1 in which switches 46, 48 and 52 are connected to the inverting input of operational amplifier OA2 and switch 50 is connected to the output of operational amplifier OA1.

In this state of switch 46, switches $6_o$ and $8_e$ of FIG. 1 makes it possible to permanently connect capacitor C1 to the inverting input of operational amplifier OA2. In the same way, switch 48 connects in parallel switches $12_e$ and $14_o$, which makes it possible to permanently connect capacitor C3 to switch $32_o$.

The biquad block shown in FIG. 3 is very slightly sensitive to the gain variations of the operational amplifiers. It also has good performance characteristics with regards to the total capacitance of the capacitors.

The biquad block shown in FIG. 3 can be used for carrying out different filtering functions, as a function of the connection chosen for applying the signal to be filtered and the connection chosen for collecting the filtered signal.

FIGS. 4a, 4b and 4c diagrammatically illustrate the state of the connections P1, P2, P3, . . . , P6 respectively corresponding to a band-pass filter, a low-pass filter and a high-pass filter.

A band-pass filter BP1 is obtained by applying the signal to be filtered $V_{in}$ to connection P5 and by collecting the filtered signal $V_{out}$ on connection P2, connections P1, P3, P4 and P6 being connected to earth. The transfer function of this filter is equal to:

$$F_{BP1}(z) = \frac{N_{BP1}(z)}{D(z)}$$

in which $$N_{BP1}(z) = -z^{-1}.(1-z^{-1}).C2.C6.C8.(C3+C4)/W$$

$$D(z) = 1 + z^{-1}\left[-2 + \frac{C4 \cdot C7 \cdot (C1 \cdot C6 + C2 \cdot C6 + C1 \cdot C8)}{W}\right] + z^{-2}\left(1 - \frac{C2 \cdot C4 \cdot C6 \cdot C7}{W}\right)$$

with $$W = C2.C5.(c3+C4).(C6+C8)$$

A low-pass filter LP1 is obtained, as shown in FIG. 4b, by applying the signal to be filtered $V_{in}$ to connection P5 and collecting the filtered signal $V_{out}$ on connection P1, connections P2, P3, P4 and P6 being connected to earth. The transfer function of this low-pass filter is equal to:

$$F_{LP1}(z) = \frac{N_{LP1}(z)}{D(z)}$$

in which $N_{LP1}(z) = -z.C4.C6.C7.C8/W$

A high-pass filter HP is obtained, as shown in FIG. 4c, by applying the signal to be filtered $V_{in}$ to connection P6 and collecting the filtered signal $V_{out}$ on connection P2, connections P1, P3, P4 and P5 being connected to earth. The transfer function of this filter is defined by:

$$F_{HP}(z) = \frac{N_{HP}(z)}{D(z)}$$

in which $N_{HP}(z) = -(1-z^{-12}.C6/C5$

FIG. 5 shows a biquad block corresponding to a second configuration of the block in FIG. 1. The biquad block of FIG. 5 is obtained by controlling switches 46, 48, 50 and 52 of FIG. 1, so as to connect nodes N1, N2, N3 and N4 to earth.

In FIG. 5, the elements identical to those in FIG. 1 carry the same references. Switches $20_e$ and $22_o$ of FIG. 1 respectively coincide in FIG. 5 with switches $12_e$ and $14_o$.

As a function of the connections chosen for the input and output of the signal. the biquad block of FIG. 5 constitutes a band-pass filter, a low-pass filter or a high-pass filter. Examples of filters are diagrammatically shown in FIGS. 6a to 6e.

Figure 6A:
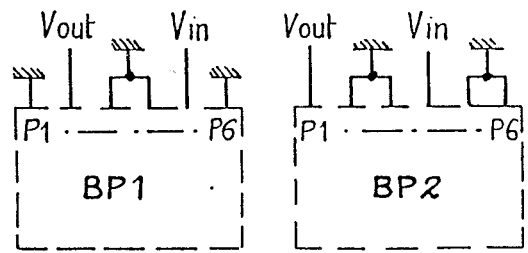
Figure 6B:
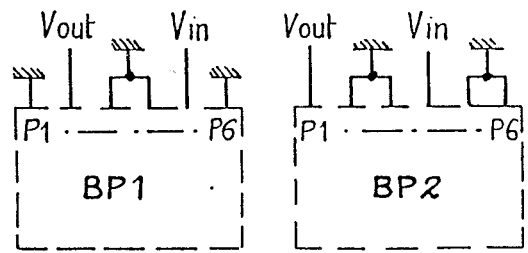
Figure 6C:
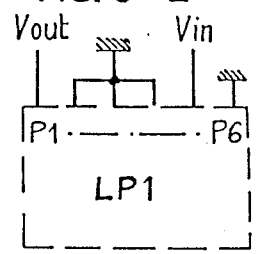
Figure 6D:
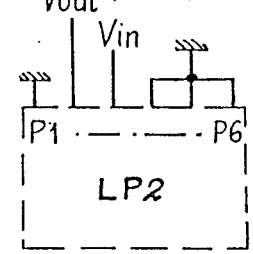
Figure 6E:
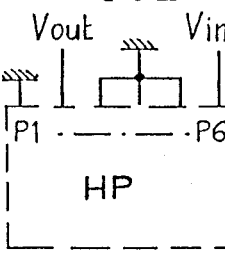

The biquad block of FIG. 5 makes it possible to obtain the filters described with reference to FIGS. 4a, 4b and 4c obtained on the basis of the biquad block of FIG. 3. Thus, FIGS. 6a, 6c and 6e show how it is possible to respectively obtain the band-pass filter BP1, the low-pass filter LP1 and the high-pass filter HP. The connections for obtaining these filters are identical to those described relative to FIGS. 4a, 4b and 4c.

The biquad block of FIG. 5 can also be connected so as to form a second band-pass filter BP2. The connection are shown in FIG. 6b. The signal to be filtered is received on connection P4 and the filtered signal is collected on connection P1, connections P2, P3, P5 and P6 being connected to earth. The transfer function of this filter is defined by:

$$F_{BP2}(z) = \frac{N_{BP2}(z)}{D(z)}$$

in which $$N_{BP2}(z) = z^{-1}(1-z^{-1})C3.C7.C5(C6+C8)/W$$

The biquad block of FIG. 5 can also be connected to form a second low-pass filter LP2. The connections for obtaining this filter are shown in FIG. 6d. The signal to be filtered is received on connection P3 and the filtered signal is collected on connection P2, connections P1, P4, P5 and P6 being connected to earth. The transfer function of this filter is defined by:

$$F_{LP2}(z) = \frac{N_{LP2}(z)}{D(z)}$$

in which $$N_{LP2}(z) = -(1-z^{-1})^2.C6/C5$$

The biquad block shown in FIG. 5 is only slightly sensitive to the capacitance ratio and has good performance characteristics with respect to the total capacitance of the capacitors.

FIG. 7 shows a third biquad block corresponding to a special configuration of that of FIG. 1. The biquad block shown in FIG. 7 corresponds to the biquad block shown in FIG. 1 in which node N1 is connected to the inverting input of operational amplifier OA2, node N2 is connected to earth, node N3 is connected to the output of the operational amplifier OA1 and node N4 is connected to earth. Thus, switches $6_o$ and $8_e$ are in parallel, which permits a permanent connection of capacitor C1 to the inverting input of operational amplifier OA2.

The biquad block shown in FIG. 7 constitutes a compromise, with regards the sensitivity to the gain of the operational amplifiers and the capacitance ratio, compared with the biquad blocks shown in FIGS. 3 and 5.

As a function of the connections chosen for the input and output of the signal, the biquad block of FIG. 7 makes it possible to obtain the band-pass filter BP1, the band-pass filter BP2, the low-pass filter LP1 and the high-pass filter HP. The connections to be made for obtaining these filters are shown in FIGS. 8a to 8d. These connections are respectively identical to those illustrated in FIGS. 6a, 6b, 6c and 6e.

For each of the filters shown in FIGS. 3, 5 and 7, the Applicant has analyzed the effect of the finite gain of the operational amplifiers on the overvoltage factor Q and on the ripple $\omega_o$ corresponding to the centre frequency $f_0$ of the signal to be processed. These parameters are defined by the following relation:

$$\omega_o \cdot T_s = \frac{C1 \cdot C4 \cdot C7}{C2 \cdot C5 \cdot (C3 + C4)}$$

$$Q = \frac{C6 + C8}{C6} \cdot \sqrt{\frac{C1 \cdot C5 \cdot (C3 + C4)}{C2 \cdot C7 \cdot C4}}$$

in which $T_s$ is the cycle of the control clock signal of the switches.

Table 1 shows the relative errors on parameters Q and $\omega_0$ for different values of the capacitors with operational amplifiers having a gain equal to 50 and for nominal values Q=16 and $\omega_o T_s = 0.25$.

In Table 1, $\eta$ representes the ratio between the capacitance of the largest capacitor and the capacitance of the smallest capacitor and $\Sigma C$ represents the sum of the capacitance of the capacitors without the auxiliary capacitors $C_x$ and $C_y$ shown in FIG. 2. For example, the capacitances of the capacitors for $\Sigma C = 34$ have as relative values:

C1=C4=5; C3=C6=C7=1; C2=5.5; C5=12; C8=3.5. C8=3.5.

TABLE 1

| $\eta$ $\Sigma c$ | 7 18 | | 7 22.1 | | 10 26.4 | | 12 34** | | 20 55 | | 30.5 84.5 | |
|---|---|---|---|---|---|---|---|---|---|---|---|---|
| Relative errors | $\frac{\Delta\omega_0}{\omega_0}$ [%] | $\frac{\Delta Q}{Q}$ [%] | $\frac{\Delta\omega_0}{\omega_0}$ [%] | $\frac{\Delta Q}{Q}$ [%] | $\frac{\Delta\omega_0}{\omega_0}$ [%] | $\frac{\Delta Q}{Q}$ [%] | $\frac{\Delta\omega_0}{\omega_0}$ [%] | $\frac{\Delta Q}{Q}$ [%] | $\frac{\Delta\omega_0}{\omega_0}$ [%] | $\frac{\Delta Q}{Q}$ [%] | $\frac{\Delta\omega_0}{\omega_0}$ [%] | $\frac{\Delta Q}{Q}$ [%] |
| Biquad block according to FIG. 3 | 2.12 | 62.6 | 2.34 | 50.8 | 2.46 | 44.4 | 2.65 | 38.0 | 2.91 | 29.1 | 3.1 | 23.1 |
| Biquad block according to FIG. 5 | 3.44 | 51.8 | 3.4 | 40.8 | 3.49 | 35.4 | 3.59 | 28.8 | 3.8 | 20.9 | 4.0 | 15.6 |
| Biquad block according to FIG. 7 | 3.90 | 55.2 | 3.74 | 48.2 | 3.72 | 45.4 | 3.74 | 45.9 | 3.89 | 47.8 | 4.1 | 49.3 |

Table 1 reveals the different properties of the biquad blocks shown in FIGS. 3, 5 and 7. The biquad blocks of FIGS. 3 and 5 have, for the same total capacitance, smaller relative errors than the biquad block of FIG. 7. The biquad block of FIG. 5 has the smallest error relative to the overvoltage for a total capacitance equal to 84.5, but the error on $\omega_o$ is high. Conversely the biquad block shown in FIG. 3 has the smallest error relative to $\omega_o$ for a total capacitance of 18, but the relative error on the overvoltage Q is then higher.

However, these results are not in themselves significant and must be compared with those corresponding to known biquad blocks. For example, the biquad block shown in FIG. 1*b* of article A2 has the following errors:

$$\Delta - \omega_0/\omega_0 = 2.76\%,$$

$$\Delta - Q/Q = 48.12\%$$

for a total capacitance $\Sigma C = 23.1$. In the same way, the biquad block shown in FIG. 5 of article A6 has the following relative errors:

$$\Delta \omega_0/\omega_0 = 2.62\%$$

$$\Delta Q/Q = 88.43\%$$

for a total capacitance equal to $\Sigma C = 29.95$.

Thus, the biquad block of FIG. 3, for which the total capacitance is 26.4 or 18, has relative errors on Q and $\omega_0$ below those of the known biquad blocks.

The influence of the gain of the operational amplifiers on the behaviour of the biquad cells is shown in FIGS. 9 to 11, where are respectively shown the overvoltage factor Q, the relative error on the overvoltage factor $\Delta Q/Q$ and the relative error on $\Delta \omega_0/\omega_0$ as a function of the amplifier gain. Each of these graphs has five curves corresponding to the biquad blocks indicated in Table 2.

| CURVE | BIQUAD BLOCK | EC | $\eta$ |
|---|---|---|---|
| 1 | Article A2: FIG. 1b | 23.1 | 8.1 |
| 2 | Invention: FIG. 3 | 18 | 7 |
| 3 | Invention: FIG. 5 | 84.5 | 30.5 |
| 4 | Invention: FIG. 3 | 34 | 12 |
| 5 | Article A6: FIG. 5 | 29.95 | 4 |

APPENDIX

Documents Quoted in the Description

A1: G. Fisher, G. S. Moschytz, SC filters for high frequencies with compensation for finite-gain amplifiers, IEEE Trans. CAS, vol. 32, Oct. 1985, pp. 1050–1056.

A2: P. E. Fleicher, K. R. Laker, A family of active switched capacitor biquad building blocks, The bell Syst. Tech. J., vol. 58, Dec. 1979, pp. 2235–2268.

A3: K. Haug. F. Maloberti, G. C. Temes, Switched-capacitor integrators with low finite-gain sensitivity, Electr. Lett., 21st Nov., vol. 21, 1985, pp. 1156–1157.

A4: K. Nagaraj, K. Singhal, T. R. Viswanathan, Y. Vlach, Reduction of finite-gain effect in switched-capacitor filters, Electr. Lett. 18th July 1985, vol.21, 1985, pp. 644–645.

A5: K. Nagaraj, J. Vlach, T. R. Viswanathan, K. Singhal switched-capacitor integrator with reduced sensitivity to amplifier gain, Electr., Lett., 9th October 1986, vol.22, no.21, pp.1103–1105.

A6: A. E. Said, M. E. Zaghloul, Stray-free switched-capacitor general biquad blocks, IEE Proc. Pt-G, Vol.133, June 1986, pp.154–158.

A7: K. R. Laker, P. E. Fleischer, A. Ganesan, Parasitic insensitive, biphase switched capacitor filters realised with one operational amplifier per pole pair. The Bell Syst. Tech., vol.61, (5), 1982, pp. 685–707.

We claim:

1. Switched capacitor biquad block filter incorporating six input-output connections P1, P2, . . . , P6 and a clock input H for receiving a clock signal for controlling the closing and opening of a group of switches, said switches comprising a first family of switches controlled in the open state during a first half-cycle of each cycle of the clock signal and which are controlled in the closed state during a second half-cycle of each cycle of the clock signal and a second family of switches controlled in the closed state during said first half-cycle of each cycle of the clock signal and in the closed state during said second half-cycle of each cycle of the clock signal, said biquad block comprising:

a first operational amplifier OA1 provided with a non-inverting input connected to earth, an inverting input E1 and an inverting output S1 connected to the first connection P1 of the filter, a second operational amplifier 0A2 provided with a non-inverting input connected to earth, an inverting input E2 and an output S2 connected to the second connection P2 of the filter, a first capacitor C1 and switches for connecting said capacitor between the output S1 of the first operational amplifier and the input E2 of the second operational amplifier during said first half-cycles of the clock signal and for connecting said capacitor to the connection P3 and to a node N1 during said second half-cycles of the clock signal, a second capacitor C2 and switches for connecting a second capacitor C2 and switches for connecting said capacitor between the input E1 and the output S1 of the first operational amplifier during said first half-cycles of the clock signal and for connecting said capacitor solely to the input E1 of the first operational amplifier during said second half-cycles of the clock signal, a third capacitor C3 and switches for connecting said capacitor between a node N2 and connection P4 during said first half-cycles of the clock signal and for connecting said capacitor between the input E2 and the output S2 of the second operational amplifier during said second half-cycles of the clock signal, a fourth capacitor C4 and switches for connecting said capacitor between a node N3 and the output S2 of the second operational amplifier during said first half-cycles of the clock signal and for connecting said capacitor between the input E2 and the output S2 of the second operational amplifier during said second half-cycles of the clock signal, a fifth capacitor C5 and switches for connecting said capacitor between input E2 and output S2 of the second operational amplifier during said first half-cycles of the clock signal and for connecting said capacitor solely to the input E2 of the second operational amplifier during said second half-cycles of the clock signal, a sixth capacitor C6 and switches for connecting said capacitor between connection P6 and input E2 of the second operational amplifier during said first half-cycles of the clock signal and for connecting said capacitor between output S1 and input E1 of the first operational amplifier during second half-cycles of the clock signal, a seventh capacitor C7 and switches for connecting said capacitor between input E1 of the first operational amplifier and a node N4 during said first half-cycles of the clock signal and for connecting said capacitor between input E1 of the first operational amplifier and output S2 of the second operational amplifier during said second half-cycles of the clock signal, an eighth capacitor C8 and switches for connecting said capacitor between connections P5 and P6 during said first half-cycles of the clock signal and for connecting said capacitor between input E1 and output S1 of the first operational amplifier during said second half-cycles of the clock signal, and four two-position switches controlled by signals applied to terminals B1, B2, B3, B4 of the biquad block, the first switch connecting node N1 to input E2 of the second operational amplifier or to earth, the second switch connecting node N2 to input E2 of the second operational amplifier or to earth, the third switch connecting node N3 to output S1 of the first operational amplifier or to earth and the fourth switch for connecting node N4 to input E2 of the second operational amplifier or to earth.

2. Switched capacitor biquad block filter according to claim 1, wherein said four two-position switches are controlled for connecting the nodes N1, N2 and N4 to the inverting input of said second operational amplifier OA2 and node N3 to the output of the first operational amplifier OA1.

3. Switched capacitor biquad block filter according to claim 1, wherein said four two-position switches are controlled so as to connect nodes N1, N2, N3 and N4 to earth.

4. Switched capacitor biquad block filter according to claim 1, wherein said four two-position switches are controlled so as to connect node N1 to the inverting input of operational amplifier OA2, node N3 to the output of operational amplifier OA1 and nodes N2 and N4 to earth.

5. Switched capacitor biquad block filter according to claim 1, wherein, for forming a band-pass filter, the input and output connections of the filter are respectively connections P5 and P2, connection P1, P3, P4 and P6 being connected to earth.

6. Switched capacitor biquad block filter according to claim 1, wherein, for forming a band-pass filter, the input and output connections of the filter are respectively connections P4 and P1, connections P2, P3, P5 and P6 being connected to earth.

7. Switched capacitor biquad block filter according to claim 1, wherein, for forming a low-pass filter, the input and output connections of the filter are respectively constituted by connections P5 and P1, connections P2, P3, P4 and P6 being connected to earth.

8. Switched capacitor biquad block filter according to claim 3, wherein, for forming a low-pass filter, the input and output connections of the filter are respectively constituted by connections P3 and P2, connections P1, P4, P5 and P6 being connected to earth.

9. Switched capacitor biquad block filter according to claim 1, wherein, for forming a high-pass filter, the input and output connections of the filter are respectively constituted by connections P6 and P2, connections P1, P3, P4 and P5 being connected to earth.

10. Switched capacitor biquad block filte according to claim 1, wherein each operational amplifier has a continuous feedback loop comprising two low capacitance capacitors $C_x$ and $C_y$ connected in series, a switch of the first family of switches and a switch of the second family of switches each located between the common point of capacitors $C_x$ and $C_y$ and earth.

* * * * *

UNITED STATES PATENT AND TRADEMARK OFFICE
CERTIFICATE OF CORRECTION

PATENT NO. : 4,841,263
DATED : June 20, 1989
INVENTOR(S) : Jan Mulawka, et al.

It is certified that error appears in the above—identified patent and that said Letters Patent is hereby corrected as shown below:

Column 10, line 29, delete "a second capacitor C2 and switches for connecting"

Column 12, line 28, delete "filte" and insert in place thereof --filter--

Signed and Sealed this

Fifteenth Day of May, 1990

*Attest:*

HARRY F. MANBECK, JR.

*Attesting Officer*    *Commissioner of Patents and Trademarks*